(12) United States Patent
Dunne

(10) Patent No.: US 8,240,186 B2
(45) Date of Patent: Aug. 14, 2012

(54) MAGNETIC SENSOR AND ACCELEROMETER CALIBRATION TECHNIQUES

(75) Inventor: Jeremy G. Dunne, Highlands Ranch, CO (US)

(73) Assignee: Laser Technology, Inc., Centennial, CO (US)

(*) Notice: Subject to any disclaimer, the term of this patent is extended or adjusted under 35 U.S.C. 154(b) by 444 days.

(21) Appl. No.: 12/157,302

(22) Filed: Jun. 9, 2008

(65) Prior Publication Data
US 2008/0270060 A1 Oct. 30, 2008

(51) Int. Cl.
*G01P 21/00* (2006.01)
(52) U.S. Cl. ........................................ 73/1.38
(58) Field of Classification Search ............... None
See application file for complete search history.

(56) References Cited

U.S. PATENT DOCUMENTS

| | | | | |
|---|---|---|---|---|
| 5,187,872 | A * | 2/1993 | Dufour | 33/356 |
| 6,729,176 | B2 * | 5/2004 | Begin | 73/1.38 |
| 7,057,173 | B2 | 6/2006 | Wright | |
| 7,112,793 | B2 | 9/2006 | Wright | |
| 2003/0212521 | A1 * | 11/2003 | Salou et al. | 702/104 |
| 2004/0149004 | A1 * | 8/2004 | Wu | 73/1.75 |
| 2005/0150295 | A1 | 7/2005 | Wright | |

OTHER PUBLICATIONS

Kwiatkowski, Waldemar and Tumański, Slawomir, The permalloy magnetoresistive sensors-properties and applications, Warsaw Technical University, ul, Koszykowa 75, PL 00-661, The Institute of Physics, J. Phys. E: Sci. Instrum, 19, 1986, pp. 502-515.

Thin Film Magnetoresistive Senors, Institute of Physics Publishing © IOP Publishing Ltd 2001, pp. iii-163, 325-336, 417-440.
Ciureaunu, Petru, "Magnetoresistive Sensors", © IOP Publishing Ltd 1992; ppvi, 253-265, 291-379, 430-436.
Hoffman, G.R., Hill, E.W. and Birtwistle, J.K., "Compensating Temperature-Induced Sensitivity Changes in Thin Film NiFeCo Magnetoresistive Magnetometers" Electricall Engineering Laboratories, University of Manchester, IEEE, vol. Mag-22, No. 5; Sep. 1986, pp. 949-951.
Casselman, Thomas N., and Hanka, Steven A., "Calculation of the Performance of a Magnetoresistive Permalloy Magnetic Field Sensor", IEEE Transactions on Magnetics, vol. Mag-16, No. 2, Mar. 1980, pp. 461-464.
Hübschmann, Stefan and Schneider, Matthias, "Magnetoresistive Sensors", ZETEX, Application Note 20, Issue 1, Apr. 1996, pp. 1-10.
Pant, Bharat B. Ph.D. and Caruso, Mike, "Magnetic Sensor Cross-Axis Effect", AN-205, Honeywell, Apr. 1996, pp. 6.
"Applications of Magnetic Position Sensors", Application Note, AN211, Honeywell Sensor Products, Solid State Electronics Center, Jan. 2002, pp. 1-8.
"Magnetoelectronics", Chapter 2, pp. 7-34.
"Magnetic Units and Definitions", SIEMENS, Silicon Hall-Effect Sensors, Semiconductor Group, Sep. 23, 1998, pp. 1-8.
Hauser, H., Stangl, G., Fallmann, W., Chabicovsky, R., Riedling, K. "Magnetoresistive Sensors", Institut für Industrielle Elektronik and Materialwissenschaften TU Wien, Preparation, Properties, and Applications of Thin Ferromagnetic Films, Jun. 2000, pp. 15-27.

(Continued)

*Primary Examiner* — Robert R Raevis
(74) *Attorney, Agent, or Firm* — William J. Kubida; Hogan Lovells US LLP

(57) ABSTRACT

The invention relates, in general, to the field of magnetic sensors and accelerometers and the utilization of the same as magnetometers, magnetic compasses, range finders, navigational systems and other applications. More particularly, the invention relates to effective, simplified and highly accurate techniques for calibration of magnetic sensors and accelerometers.

25 Claims, 2 Drawing Sheets

OTHER PUBLICATIONS

"1 and 2-Axis Magnetic Sensors", HMC1051/HMC1052, Honeywell, Jul. 2001, pp. 1-8.
"Three-Axis Magnetic Sensor Hybrid", HMC2003, Honeywell, Oct. 1997, pp. 1-4.
"Digital Compass Module", HMR3000, Honeywell, Dec. 1999, pp. 1-4.
"Magnetic Field Sensor", KMZ10B, Data Sheet, Philips Semiconductors, Mar. 31, 1998, pp. 1-8.
"Magnetic Field Sensor", KMZ51, Data Sheet, Philips Semiconductors, Jun. 13, 2000, pp. 1-8.
"Magnetic Field Sensor", KMZ52, Data Sheet, Philips Semiconductors, Jun. 9, 2000, pp. 1-12.
"Tiny Low Power Operational Amplifier with Rail-To-Rail Input and Output", LMC7101, National Semiconductor, Sep. 1999, pp. 1-18.
"Magnetic Units", SIEMENS, Semiconductor Group, Feb. 18, 1999, p. 1.
"Magnetic Sensor Products HMC/HMR Series", Honeywell, Solid State Electronics Center, Oct. 1996, pp. 1-4.
Montaigne, Francois; Schuhl, Alain; Dau, Nguyen Van Frédéric, Encinas, Armando, Development of magnetoresistive sensors based on planar Hall effect for applications to microcompass, Sensors and Actuators 81 (2000) 324-327, Elsevier Science, 2000, pp. 324-327.
Caruso, Michael J., Bratland, Tamara, Smith, Carl H. Dr., Schneider, Robert, "A New Perspective on Magnetic Field Sensing", Honeywell, Inc. May 1998, pp. 1-19.
"General Sensor Systems", Data Sheet, Philips Semiconductors, Jan. 9, 1997, pp. 1-16.
"General Magnetoresistive sensors for magnetic field measurement", Philips Semiconductors, Sep. 6, 2000, pp. 1-74.
"General Magnetic field sensors", Data Sheet, Philip Semiconductors, Jun. 12, 1998, pp. 1-58.
"General Temperature sensors", Data Sheet, Philips Semiconductors, Dec. 5, 1996, pp. 1-18.
Dibbern, U., "The Amount of Linearization by Barber-Poles", IEEE Transactions on Magnetics, vol. Mag-20, No. 5, Sep. 1984, pp. 954-956.
Feng, J. S. Y., Romankiw, L. T., and Thompson, D. A., "Magnetic Self-Bias in the Barber Pole MR Structure", IEEE Transactions on Magnetics vol. Mag-13, No. 5, Sep. 1977, pp. 1466-1468.
Fluitman, J. H. J., "Recording Head Field Measurement With a Magnetoresistive Transducer", IEEE Transactions on Magnetics, vol. Mag-14, No. 5, Sep. 1978, pp. 433-435.
Flynn, David I., "A New Technique of Noise Reduction for Large Aspect Magnetoresistors", IEEE Transactions on Magnetics, vol. 30, No. 3, May 1994, pp. 1263-1266.
Flynn, David, "A Vector Magnetometer using a Single Permalloy Sensor with Dual Magnetic Feedback", IEEE Transactions on Magnetics, vol. 30, No. 6, Nov. 1994, pp. 5038-5041.
Hauser, H., Fulmek, P. L., Haumer, P., Vopalensky, M., Ripka, P., "Flipping field and stability in anisotropic magnetoresistive sensors", Sensors and Actuators A 106 (2003), Elsevier, pp. 121-125.
Hauser, Hans, Stangl, Günther, Hochreiter, Johann, "High-performance magnetoresistive sensors", Sensors and Actuators 81 (2000), Elsevier, pp. 27-31.
Hill, E. W. and Birtwistle, J. K., "Sputtered Permanent Magnet Arrays for MR Sensor Bias", IEEE Transactions on Magnetics, vol. Mag-23, No. 5, Sep. 1987, pp. 2419-2421.
Hill, E. W., Halter, D. S., and Birtwistle, J. K., "MR Vector Sensor with Trimmable Sense Axis Direction", IEEE Transactions on Magnetics, vol. 25, No. 5, Sep. 1989, pp. 3836-3838.
Hoffman, G. R. and Birtwistle, J. K., "Factors affecting the performance of a thin film magnetoresistive vector magnetometer", J. Appl. Phys 53 (110, Nov. 1982, pp/ 8266-8268.
Hoffman, G. R., Hill, E. W., and Birtwistle, J. K., "Thin Film Magnetoresistive Vector Sensors with Submicron Gap Width", IEEE Transactions on Magnetics, vol. Mag-20, No. 5, Sep. 1984, pp. 957-959.
Hunt, Robert P., "A Magnetoresistive Readout Transducer", IEEE Transactions on Magnetics, vol. Mag-7, No. 1, Mar. 1971, pp. 150-154.
Kaplan, Ben-Zion, Paperno, Eugene and Flynn, David I., "In-Plane Vector Magnetometer Employing a Single Unbiased Magnetoresistor", IEEE Transactions on Magnetics, vol. 34, No. 1, Jan. 1998, pp. 253-258.
Koehler, T. R., Yang, Bo, Chen, Wenjie and Fredkin, D. R., "Simulation of Magnetoresistive response in a small Permalloy strip", J. Appl. Phys. 73 (10), May 15, 1993, pp. 6504-6506.
Kuijk, K. E., van Gestel, W. J. and Gorter, F. W., "The Barber Pole, A Linear Magnetoresistive Head", IEEE Transactions on Magnetics, vol. Mag-11, No. 5, Sep. 1975, pp. 1215-1217.
Kwiatkowski, W., Stabrowski, M. and Tumański, S., "Numerical Analysis of The Shape Anisotropy and Anisotropy Dispersion in Thin Film Permalloy Magnetoresistors", IEEE Transactions on Magnetics, vol. Mag-19, No. 6, Nov. 1983, pp. 2502-2505.
Kwiatkowski, W. Baranowski, B. and Tumański, S., "Application of the Thin Film Permalloy Magnetoresistive Sensors in Electrical Measurements", IEEE Transactions on Magnetics, vol. Mag-20, No. 5, Sep. 1984, pp. 966-968.
Mapps, D. J., Watson, M. L. and Fry, N., "A Double Bifilar Magneto-Resistor for Earth's Field Detection", IEEE Transactions of Magnetics, vol. Mag-23, No. 5, Sep. 1987, pp. 2413-2415.
Mohri, Kaneo, Uchiyama, Tsuyoshi and Panina, Larissa V., "Recent advances of micro magnetic sensors and sensing application", Sensors and Actuators A59 (1997), Elsevier, pp. 8.
Moran, Timothy J., Dahlberg, Dan E., "Magnetoresistive sensor for weak magnetic fields", Appl. Phys. Lett. 70 (14), Apr. 7, 1997, pp. 1894-1896.
Pant, Bharat B. and Krahn, Donald R., "High-sensitivity magnetoresistive transducers", J. Appl. Phys. 69 (8), Apr. 15, 1991, pp. 5936-5938.
Pant, Bharat B., "Effect of Interstrip gap on the sensitivity of high sensitivity magnetoresistive transducers", J. Appl. Phys. 79 (8), Apr. 15, 1996, pp. 6123-6125.
Pant, Bharat B., "Scaling in thin magnetoresistive films", J. Appl. Phys. 67, (1), Jan. 1, 1990, pp. 414-419.
Paperno, Eugene, Kaplan, Ben-Zion, "Simultaneous Measurement of Two DC Magnetic Field Components by a Single Magnetoresistor", IEEE Transactions on Magnetics, vol. 31, No. 3, May 1995, pp. 2269-2273.
Kaplan, Ben-Zion, Paperno, Eugene, "New Method for Extracting Signals Generated by Magnetoresistive Sensors", IEEE Transactions on Magnetics, vol. 30, No. 6, Nov. 1994, pp. 4614-4616.
Paperno, Eugene and Kaplan, Ben-Zion, "Suppression of Barkhausen Noise in Magnetoresistive Sensors Employing AC Bias", IEEE Transactions on Magnetics, vol. 31, No. 6, Nov. 1995, pp. 3161-3163.
Ripka, P., "Alternating current excited magnetoresistive sensor", J. Appl. Phys. 79 (8), Apr. 15, 1996, pp. 5211-5213.
Soohoo, R. F., "Repeatability of Barkhausen Transitions in Thin Films", IEEE Transactions on Magnetics, vol. 30, No. 1, Jan. 1994, pp. 23-25.
Tsang, C. and Decker, S. K., "The origin of Barkhausen noise in small permalloy magnetoresistive sensors", J. Appl. Phys. 52 (3), Mar. 1981, pp. 2465-2467.
Tumański, S., "A New Type of Thin Film Magnetoresistive Magnetometer—An Analysis of Circuit Principles", IEEE Transactions on Magnetics, vol. Mag-20, No. 5, Sep. 1984, pp. 1720-1722.
Tumański, S., Stabrowski, M. M., "Optimization of the Performance of a Thin Film Permalloy Magnetoresistive Sensor", IEEE Transactions on Magnetics, vol. Mag-20, No. 5, Sep. 1984, pp. 963-965.
Sosa, M., Carneiro, A. A. O., Baffa, O., Colafemina, J. F., "Human ear tympanum oscillation recorded using a magnetoresistive sensor", Review of Scientific Instruments, vol. 73, No. 10, Oct. 2002, pp. 3695,3697.
Ueda, M., Endoh, M., Yuoda, H. and Wakatsuki, N., "AC Bias Type Magnetoresistive Sensor", IEEE Transactions on Magnetics, vol. 26, No. 5, Sep. 1990, pp. 1572-1574.
Vicent, J. L., "The development of a sinusoidal voltage in thin ferromagnetic films and the measurement of low magnetic fields", J. Phys. D: Appl. Phys., vol. 11, 1978, pp. L29-L31.
de Niet, E. and Vreeken, R., "A Magnetoresistive Head with Magnetic Feedback", IEEE Transactions on Magnetics, vol. Mag-15, No. 6, Nov. 1979, pp. 1625-1627.

Yeh, Tangshium and Witcraft, William F., "Effect of Magnetic Anisotropy on Signal and Noise of NiFe Magnetoresistive Sensor", IEEE Transactions on Magnetics, vol. 31, No. 6, Nov. 1995, pp. 3131-3133.

"Precision ±1.7 g Single-/Dual-Axis iMEMS® Accelerometer", ADXL103/ADXL203, Analog Devices, Inc., Norwood, MA, 2006, pp. 1-12.

"PNI MicroMag 3 3-Axis Magnetic Sensor Module", PNI Corporation, Santa Rosa, CA, revised Jun. 2006, pp. 1-12.

""LIS302DL, MEMS motion sensor 3-axis—±2g/ ±8g smart digital output "piccolo" accelerometer"", ST, rev. 3, Oct. 2007, pp. 1-42.

Fluitman, J.H.J., The Influence of Sample Geometry on the Magnetoresistance of Ni-Fe Films, Thin Solid Films, 16 (1973), pp. 269-276.

Magnetoresistive sensors for magnetic field measurement, Philips Semiconductors, Sep. 6, 2000, pp. 15-20.

Stork, Thomas N., "Electronic Compass Design using KMZ51 and KMZ52", Application Note AN00022; Philips Semiconductors Systems Laboratory, Hamburg, Germany, pp. 1-38, Mar. 3, 2000.

"1-and 2-Axis Magnetic Sensors", HMC1001/1002, HMC 1021/1022, Honeywell, Apr. 2000, pp. 1-15.

"Three-Axis Magnetoresistive Sensor", HMC 1023, Honeywell, Feb. 2000, pp. 1-4.

"SCA3000-D01 3-Axis Low Power Accelerometer with Digital SPI Interface", VTI Technologies Oy, Doc. No. 8255700A.02, pp. 1-4, Oct. 31, 2007.

Hoffman, G. R. et al., "The Performance of Magnetoresistive Vector Magnetometers With Optimised Conductor and Anisotropy Axis Angles", IEEE Transactions on Magnetics, vol. MAG-19, No. 5, pp. 2139-2141, Sep. 1983.

Laser Technology, Inc., "TruPulse 360/360B", User's Manual, Sep. 2007, pp. 1-57, Centennial, CO, USA.

Laser Technology, Inc. "Laser Technology Unveils TruPulse 360—Next-generation reflectorless laser rangefinder with an integrated compass", www.lasertech.com/news/june12_07.html, Jun. 12, 2007, Centennial, CO, USA.

* cited by examiner

MAGNETIC SENSOR AND ACCELEROMETER CALIBRATION TECHNIQUES

This application contains subject matter which is related to U.S. patent application Ser. No. 10/751,806 filed on Jan. 5, 2004, now U.S. Pat. No. 7,057,173 which is hereby incorporated by reference for all purposes as if fully set forth herein. The application also contains subject matter which is related to U.S. patent application Ser. No. 11/025,740 filed on Dec. 22, 2004, now U.S. Pat. No. 7,112,793 which is hereby incorporated by reference for all purposes as if fully set forth herein.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the United States Patent and Trademark Office patent file or records, but otherwise, reserves all copyright rights. The following notice applies to the software and data described below, inclusive of the drawings and figures where applicable: Copyright ©2003 Laser Technology, Inc.

BACKGROUND OF THE INVENTION

1. Field of the Invention

The invention relates, in general, to the field of magnetic sensors and accelerometers and the utilization of the same as magnetometers, magnetic compasses, range finders, navigational systems and other applications. More particularly, the invention relates to effective, simplified and highly accurate techniques for calibration of magnetic sensors and accelerometers.

2. Discussion of the Related Art

Currently available are a number of conventional magnetic sensor and accelerometer designs and techniques for utilizing them in compassing, navigational systems and other applications. In this regard, representative references include: Caruso et al., "A New Perspective on Magnetic Field Sensing" published by Honeywell, Inc. May, 1998 (hereinafter "New Perspectives"); a Honeywell Sensor Products Datasheet for the HMC1001/1002 and HMC1021/1022 1- and 2-Axis Magnetic Sensors published April, 2000 (hereinafter "Honeywell Datasheet"); a Honeywell Application Note AN-205 entitled "Magnetic Sensor Cross-Axis Effect" by Pant, Bharat B. (hereinafter "AN-205"); and a Philips Semiconductors publication entitled: "Magnetoresistive Sensors for Magnetic Field Measurement", published Sep. 6, 2000 (hereinafter "Philips Publication"). The disclosures of these references are herein specifically incorporated by this reference in their entirety.

Specifically, the New Perspectives document provides an overview of magnetoresistive and other magnetic sensing technologies while the Honeywell Datasheet provides a detailed description of the particular magnetoresistive sensors as may be utilized in a representative embodiment of the present invention disclosed herein. The AN-205 application note describes conventional techniques for the elimination of magnetic cross-terms in magnetoresistive sensors while the Philips Publication provides a detailed description of magnetoresistive sensor functionality including relevant mathematics.

Accelerometers are known in the art. Some conventional accelerometers include VTI Technologies, SCA 3000 series accelerometer, ST Microelectronics, LIS 302 series accelerometer and Analog Devices, ADXL 103 and ADXL 203 series accelerometers.

There is currently a need for calibration techniques that are effective, simplified and highly accurate in order to calibrate magnetic sensors and accelerometers utilized in magnetometers, magnetic compasses, range finders, navigational systems and other applications.

SUMMARY OF THE INVENTION

Accordingly, the invention is directed to magnetic and accelerometer calibration techniques that substantially obviate one or more of the problems due to limitations and disadvantages of the related art.

An advantage of the invention is to provide simplified and highly accurate techniques for calibration of magnetic sensors and accelerometers.

Another advantage of the invention is to provide calibration of magnetic sensors and accelerometers to minimize inaccuracies that may be caused by temperature induced drift, battery aging, replacement of batteries and other events that may cause distortions.

Additional features and advantages of the invention will be set forth in the description which follows, and in part will be apparent from the description, or may be learned by practice of the invention. The features of the invention will be realized and attained by the structure particularly pointed out in the written description and claims hereof as well as the appended drawings.

To achieve these and other advantages and in accordance with the purpose of the invention, an embodiment of the invention is directed towards a method for calibrating sensors of an apparatus. The calibration includes sampling at least four data points to obtain measured field values. Performing a mathematical operation to obtain offset values for the measured values and correcting the measured field values with the offset values to calibrate the apparatus.

Another embodiment of the invention is directed towards, an apparatus including a plurality of sensors and a controller coupled to the plurality sensors. The plurality of sensors is capable of being calibrated by sampling at least four data points to obtain measured field values. A mathematical operation can be performed with the controller to obtain offset values of the measured field values. The offset values are used to correct the measured field values.

Yet another embodiment of the invention is directed to an apparatus including a plurality of magnetic sensors to measure a magnetic field, a plurality of accelerometers to measure a gravitational field, and a controller coupled to the plurality of magnetic sensors and the plurality of accelerometers. The plurality of magnetic sensors and the plurality of accelerometers are capable of being calibrated by sampling at least four data points from the plurality of magnetic sensors to obtain measured magnetic field values and sampling at least four data points from the plurality of accelerometers to obtain measured gravitational field values. The controller is capable of performing a mathematical operation to obtain offset values corresponding to each of the measured magnetic field values and measured gravitational field values. The plurality of magnetic sensors and accelerometers are capable of being calibrated with the offset values for each of the measured magnetic field values and measured gravitational field values with the offset values.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

The invention relates, in general, to the field of magnetic sensors and accelerometers and the utilization of the same as magnetometers, magnetic compasses, range finders, navigational systems and other applications. More particularly, the invention relates to effective, simplified and highly accurate techniques for calibration of magnetic sensors and accelerometers.

The calibration may be performed by an end user in the field and is designed to substantially eliminate distortions or inaccuracies caused by, for example, temperature-induced drift, battery aging, and replacing the batteries. The calibration techniques can have an accuracy of half a degree or greater for either the magnetic sensors or accelerometers. In embodiments of the invention, the calibration technique is performed on at least one of magnetic sensors and accelerometers which are used in magnetometers, magnetic compasses, range finders, navigational systems and other apparatuses.

Reference will now be made in detail to embodiments of the invention, example of which are illustrated in the accompanying drawings and related text.

Figure 1:
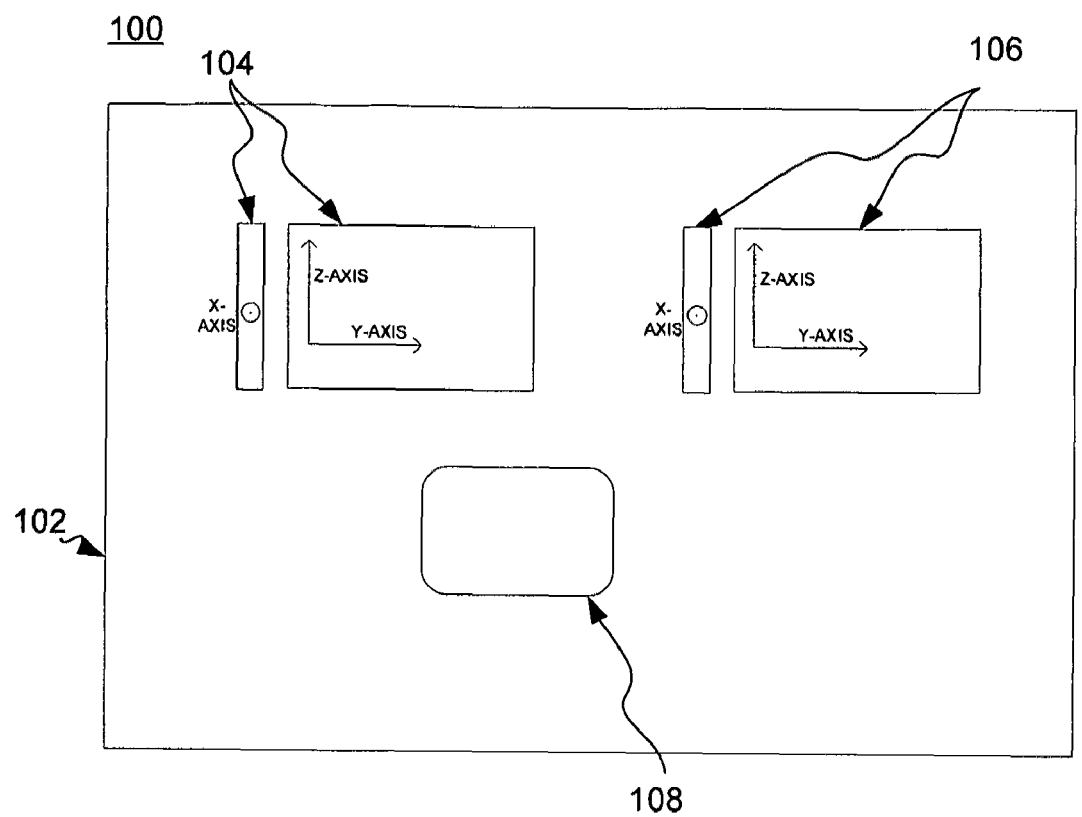
FIG. 1 illustrates an apparatus according to an embodiment of the invention.

FIG. 1 illustrates an apparatus according to an embodiment of the invention. Referring to FIG. 1, the apparatus is generally depicted as reference number 100 and includes a circuit board 102 having at least two magnetic sensors 104 and optionally at least two accelerometers 106. The apparatus further includes a controller 108, e.g., microcontroller, such as an Atmel ATMega 64 microcontroller. The magnetic sensors 104 and accelerometers 106 are electrically and communicably coupled together and to the controller 108.

There are a number of conventional magnetic sensor designs and techniques that can be utilized in the apparatus of the invention. The apparatus may be a magnetic compass or a range finder, such as a TruPulse™ 360/360B apparatus manufactured by Laser Technology, Inc., of Colorado. In this regard, representative references include: Caruso et al., "A New Perspective on Magnetic Field Sensing" published by Honeywell, Inc. May, 1998 (hereinafter "New Perspectives"); a Honeywell Sensor Products Datasheet for the HMC1001/1002 and HMC1021/1022 1- and 2-Axis Magnetic Sensors published April, 2000 (hereinafter "Honeywell Datasheet"); a Honeywell Application Note AN-205 entitled "Magnetic Sensor Cross-Axis Effect" by Pant, Bharat B. (hereinafter "AN-205"); and a Philips Semiconductors publication entitled: "Magnetoresistive Sensors for Magnetic Field Measurement", published Sep. 6, 2000 (hereinafter "Philips Publication"). Any of these sensors may be utilized in the apparatus to perform calibration techniques. The disclosures of these references are herein specifically incorporated by this reference in their entirety.

The New Perspectives document provides an overview of magnetoresistive and other magnetic sensing technologies while the Honeywell Datasheet provides a detailed description of the particular magnetic sensors as may be utilized in representative embodiments of the invention. The AN-205 application note describes conventional techniques for the elimination of magnetic cross-terms in magnetoresistive sensors while the Philips Publication provides a detailed description of magnetoresistive sensor functionality including relevant mathematics. In addition, magneto-inductive sensors from PNI Corporation of Santa Rosa, Calif. may also be used in the invention. More specifically, the magneto-inductive sensors may be the PNI MicroMag 3 an integrated 3-axis magnetic field sensing module. The PNI MicroMag3 datasheet is hereby incorporated by reference as if fully set forth herein.

In a preferred embodiment, the magnetic sensors 104 are Honeywell Sensors HMC1021/1022 1- and 2-Axis sensors. The dual axis sensor lies on the plane of the board 102 forming the y and z magnetic axes, while the single axis sensor is mounted at right angles to the plane of the board 102 forming the x magnetic axis Accelerometer designs and techniques for utilizing in the apparatus, which may be a magnetic compass or a range finder, such as a TruPulse™ 360/360B apparatus manufactured by Laser Technology, Inc, of Colorado. Accelerometers are known in the art, some conventional accelerometers include VTI Technologies, SCA 3000 series accelerometer, such as the SCA3000-D01 3-Axis Low Power Accelerometer with Digital SPI Interface, the datasheet of which is hereby incorporated by reference as if fully set forth herein. In addition, ST Microelectronics MEMS motion sensors may also be used, such as LIS302DL 3-axis MEMS motion sensor, the data sheet of which is hereby incorporated reference as if fully set forth herein. Also, Analog Devices accelerometers may also be used, such as ADXL 103 and ADXL 203 series accelerometer, which may be used in aspects of the invention. The ADXL 103/ADXL 203 data sheet is hereby incorporated by reference as is fully set forth herein. Moreover, the accelerometer may also be a tilt sensor as known in the art.

In a preferred embodiment, the accelerometers 106 are Analog Devices ADXL103/203 1 and 2 axis sensors, the data sheets of each sensor are hereby incorporated by reference. The dual axis sensor lies on the plane of the board 102 forming the y and z gravity axes while the single axis sensor is mounted at right angles to the plane of the board 102, forming the x gravity axis.

Turning now to the calibration techniques of the invention, the techniques may be used on an apparatus having magnetic sensors and/or accelerometers such as a magnetometer, magnetic compass, range finder, navigational system and the like. In this embodiment, the apparatus is generally described in FIG. 1. In particular, the magnetic field vector and gravity vector are calibrated to obtain a true North heading and true tilt angle that is substantially free from distortion and accurate to within 0.5 degrees or greater. The earth's magnetic field is basically constant having a typical value of 0.6 gauss, and the earth's gravitation field is basically constant having a value of 1 G. By obtaining magnetic sensor readings from an orthogonal array of sensors, the square root of the sum of the squares of the readings is equal to the Earth's magnetic field. By obtaining accelerometer readings from an orthogonal array of sensors, the square root of the sum of the squares of the readings is equal to the Earth's gravity field. In other words, all the data points from the magnetic sensors' and accelerometers' readings lie on the surface of a sphere. As such, the center of that sphere includes the offset values that will be used in the calibration techniques of the invention.

More particularly, the calibration techniques of the invention calibrate the magnetic sensors and accelerometers independent of each other improving accuracy of the calibration. A nominally orthogonal system is required for the calibration process. For a given spherical space, an iterative solution is utilized to find a radius of the sphere R and center coordinates of the sphere ($x_o$, $y_o$, $z_o$). The center coordinates of the sphere are the offsets that the calibration technique will use to calibrate the sensors of the apparatus.

The calibration technique starts with sampling data points on an apparatus including magnetic sensors and/or accelerometers. The minimum number of data points should be greater than or equal to 4 for calibration of magnetic sensors and/or accelerometers. As the number of data points increases, the accuracy of the calibration can be increased as noise is reduced. In a preferred embodiment eight data points are used for calibrating the magnetic sensors and/or accelerometers.

In a nominally orthogonal system the data points from the magnetic sensors and/or accelerometers are taken as the user rotates the apparatus about an axis. In a preferred embodiment, the data points from the magnetic sensors and/or accelerometers are obtained at roughly ninety degree rotations of the apparatus. It is noted that other rotation techniques for data sampling may be used, for example a user may simply position the apparatus in four different orientations to obtain the data points at each orientation. That is, data points are ideally sampled to lie on the surface of the sphere whose radius is the measured vector magnitude as shown in FIG. 2.

Figure 2:
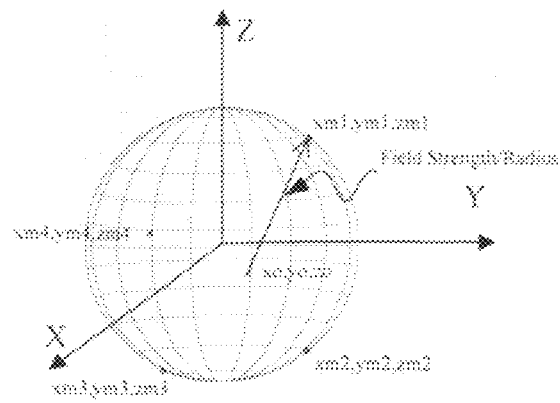
FIG. 2 illustrates a nominal orthogonal system according to another embodiment of the invention.

More specifically, FIG. 2 represents a nominally orthogonal sensor system. Since the measured field vector is constant and the sensors are aligned with the system axes x, y, z, then when the system is rotated and data taken for the x, y, z sensors, the measured values lie on the surface of the sphere of radius, R equals F, which is the field strength R=F, (the field strength) and centered at the offset values $x_o$, $y_o$, $z_o$)

$$x_m = x_f + x_o;$$

$$y_m = y_f + y_o;\text{ and}$$

$$z_m = z_f + z_o.$$

In these equations, subscript m is a symbol to indicate the measured field, subscript f is a symbol to indicate the actual field and subscript o is a symbol to indicate the offset. More particularly, $x_m$ is the measured field value on the x-axis, $x_f$ is the actual field value on the x-axis and $x_o$ is the offset value on the x-axis. $y_m$ is the measured field value on the y-axis, $y_f$ is the actual field value on the y-axis and $y_o$ is the offset value on the y-axis. $z_m$ is the measured field value on the z-axis, $z_f$ is the actual field value on the z-axis and $z_o$ is the offset value on the z-axis. In this embodiment, an iterative mathematical method is used to solve for offset values $x_o$, $y_o$, $z_o$.

A minimum of 4 data points (x, y, z) define the surface of a sphere having a center at $x_o$, $y_o$, $z_o$ as shown in FIG. 2. Finding the offset values $x_o$, $y_o$, $z_o$ can be accomplished as any point of a sphere satisfies the implicit equation of a sphere:

$$(x_m - x_o)^2 + (y_m - y_o)^2 + (z_m - z_o)^2 = R^2$$

It is noted that as the number of data points, e.g., measured values, is increased effects of noise on the calibration result is minimized. The offset values $x_o$, $y_o$, $z_o$ can be obtained by iteratively solving the equation:

$$R = \left(\frac{1}{n}\sum_{i=1}^{n}[(x_{mi} - x_0)^2 + (y_{mi} - y_0)^2 + (z_{mi} - z_0)^2]\right)^{1/2}$$

After the offset values are obtained the error in the system can be substantially eliminated by subtracting the offset values from the measured values. Typically, the accuracy of sensors can be obtained to 0.5 degrees or less.

In embodiments of the invention, the measured values of the magnetic sensors are represented by the equations:

$$x_{mm} = x_{fm} + x_{om};$$

$$y_{mm} = y_{fm} + y_{om};\text{ and}$$

$$z_{mm} = z_{fm} + z_{om}.$$

In the equations, subscript mm is a symbol to indicate the measured magnetic field, subscript fm is a symbol to indicate the actual magnetic field and subscript om is a symbol to indicate the magnetic sensor offset. Therefore, $x_{mm}$ is the measured magnetic field value on the x-axis, $x_{fm}$ is the actual magnetic field value on the x-axis and $x_{om}$ is the offset magnetic value on the x-axis. $y_{mm}$ is the measured magnetic field value on the y-axis, $y_{fm}$ is the actual magnetic field value on the y-axis and $y_{om}$ is the offset magnetic field value on the y-axis. $z_{mm}$ is the measured magnetic field value on the z-axis, $z_{fm}$ is the actual magnetic field value on the z-axis and $z_{om}$ is the offset magnetic value on the z-axis. In this embodiment, finding offset values $x_{om}$, $y_{om}$, $z_{om}$ can be accomplished as any point of a sphere satisfies the implicit equation of a sphere, $$(x_{mm} - x_{om})^2 + (y_{mm} - y_{om})^2 + (z_{mm} - z_{om})^2 = R^2$$

It is noted that as the number of data points is increased effects of noise on the result is reduced. Therefore, the offset values $x_{om}$, $y_{om}$, $z_{om}$ can be found by iteratively solving the equation:

$$R = \left(\frac{1}{n}\sum_{i=1}^{n}[(x_{mmi} - x_{0m})^2 + (y_{mmi} - y_{0m})^2 + (z_{mmi} - z_{0m})^2]\right)^{1/2}$$

After the offset values are obtained the error in the system can be substantially eliminated by subtracting the offset values from the measured values.

In embodiments of the invention, the measured values of the accelerometers are represented by the equations:

$$x_{mt} = x_{ft} + x_{ot};$$

$$y_{mt} = y_{ft} + y_{ot};\text{ and}$$

$$z_{mt} = z_{ft} + z_{ot}.$$

In the equations, subscript mt is a symbol to indicate the measured gravitation field, subscript ft is a symbol to indicate the actual gravitation field and subscript ot is a symbol to indicate the accelerometer offset. Therefore, $x_{mt}$ is the measured gravitation field value on the x-axis, $x_{ft}$ is the actual gravitation field value on the x-axis and $x_{ot}$ is the offset gravitation field on the x-axis. $y_{mt}$ is the measured gravitation field value on the y-axis, $y_{ft}$ is the gravitation field value on the y-axis and $y_{ot}$ is the gravitation field value on the y-axis. $z_{mt}$ is the measured gravitation field value on the z-axis, $z_{ft}$ is the gravitation field value on the z-axis and $z_{ot}$ is the offset gravitation field value on the z-axis. In this embodiment, an iterative mathematical method is used to solve for offset values $x_{ot}$, $y_{ot}$, $z_{ot}$.

A minimum of 4 data points (x, y, z) define the surface of a sphere having a center at $x_{ot}$, $y_{ot}$, $z_{ot}$. Finding values for $x_{ot}$, $y_{ot}$, $z_{ot}$ can be accomplished as any point of a sphere satisfies the implicit equation of a sphere:

$$(x_{mt} - x_{ot})^2 + (y_{mt} - y_{ot})^2 + (z_{mt} - z_{ot})_2 = R^2$$

It is noted that as the number of data points is increased effects of noise is minimized. The offset values $x_{ot}$, $y_{ot}$, $z_{ot}$ can be found by iteratively solving the equation:

$$R = \left(\frac{1}{n}\sum_{i=1}^{n}[(x_{mti} - x_{0t})^2 + (y_{mti} - y_{0t})^2 + (z_{mti} - z_{0t})^2]\right)^{1/2}$$

After the offset values are obtained the error in the system can be substantially eliminated by subtracting the offset values from the measured values.

The equations as discussed herein may be solved via software implemented on a controller, e.g., microcontroller, or other devices as known in the art. In one embodiment, a microcontroller, e.g., an Atmel ATMega 64 microcontroller, executes software code for iteratively solving equations herein. In a preferred embodiment, the software code is:

```
void ManageUserMagCal(void)
{
X_Average = 0;
Y_Average = 0;
Z_Average = 0;
loop = 0;
UMC_Sums[X_AXIS] = 1e6;//set all these really huge right now so we can-
UMC_Sums[Y_AXIS] = 1e6;//-get through the first sum limit check.
UMC_Sums[Z_AXIS] = 1e6;
for(i = 0;i < UMC_NUMBER_OF_POSITIONS;i++)//sum the contents of the mag-
    {//-arrays into sx, sy, and sz
    X_Average += UMC_Mag_Array_X[i];
    Y_Average += UMC_Mag_Array_Y[i];
    Z_Average += UMC_Mag_Array_Z[i];
    }
X_Average /= UMC_NUMBER_OF_POSITIONS;//average the sums by dividing-
Y_Average /= UMC_NUMBER_OF_POSITIONS;//-by their weight
Z_Average /= UMC_NUMBER_OF_POSITIONS;
while(((UMC_Sums[X_AXIS] > FD.UMC_Sum_Limit) || \
    (UMC_Sums[Y_AXIS] > FD.UMC_Sum_Limit) || \
    (UMC_Sums[Z_AXIS] > FD.UMC_Sum_Limit)) && \
    (loop < FD.UMC_Loop_Limit))//run this loop as long as we don't meet-
    //-the sum limit AND we haven't done too many loops
{
//here's the start of the X iteration
diffstep = FD.UMC_Initial_Step_Size;
oldsum = 0;
UMCGetDiffSum( );
abs_helper = Diff_Sum - oldsum;
if(abs_helper < 0)
    abs_helper = -abs_helper;
while(abs_helper > FD.UMC_Difference_Limit)
    {
    if((diffstep < 0) && (diffstep > (-FD.UMC_Final_Step_Size)))
        //if dstep is too small and negative, make it equal to the-
        diffstep = -FD.UMC_Final_Step_Size;//-smallest negative
    if((diffstep >= 0) && (diffstep < FD.UMC_Final_Step_Size))
        //if dstep is too small and positive, make it equal to the-
        diffstep = FD.UMC_Final_Step_Size;//-smallest positive
    oldsum = Diff_Sum;
    X_Average += diffstep;
    UMCGetDiffSum( );
    loop++;
    if(Diff_Sum > oldsum)
        diffstep = -(diffstep / 2);
    abs_helper = Diff_Sum - oldsum;
    if(abs_helper < 0)
        abs_helper = -abs_helper;
    }
UMC_Sums[X_AXIS] = Diff_Sum;
//here's the start of the Y iteration
diffstep = FD.UMC_Initial_Step_Size;
oldsum = 0;
UMCGetDiffSum( );
abs_helper = Diff_Sum - oldsum;
if(abs_helper < 0)
    abs_helper = -abs_helper;
while(abs_helper > FD.UMC_Difference_Limit)
    {
    if((diffstep < 0) && (diffstep > (-FD.UMC_Final_Step_Size)))
        //if dstep is too small and negative, make it equal to the-
        diffstep = -FD.UMC_Final_Step_Size;//-smallest negative
    if((diffstep >= 0) && (diffstep < FD.UMC_Final_Step_Size))
        //if dstep is too small and positive, make it equal to the-
        diffstep = FD.UMC_Final_Step_Size;//-smallest positive
    oldsum = Diff_Sum;
    Y_Average += diffstep;
```

-continued

```
      UMCGetDiffSum( );
      loop++;
      if(Diff_Sum > oldsum)
          diffstep = -(diffstep / 2);
      abs_helper = Diff_Sum - oldsum;
      if(abs_helper < 0)
          abs_helper = -abs_helper;
      }
   UMC_Sums[Y_AXIS] = Diff_Sum;
   //here's the start of the Z iteration
   diffstep = FD.UMC_Initial_Step_Size;
   oldsum = 0;
   UMCGetDiffSum( );
   abs_helper = Diff_Sum - oldsum;
   if(abs_helper < 0)
      abs_helper = -abs_helper;
   while(abs_helper > FD.UMC_Difference_Limit)
      {
      if((diffstep < 0) && (diffstep > (-FD.UMC_Final_Step_Size)))
         //if dstep is too small and negative, make it equal to the-
         diffstep = -FD.UMC_Final_Step_Size;//-smallest negative
      if((diffstep >= 0) && (diffstep < FD.UMC_Final_Step_Size))
         //if dstep is too small and positive, make it equal to the-
         diffstep = FD.UMC_Final_Step_Size;//-smallest positive
      oldsum = Diff_Sum;
      Z_Average += diffstep;
      UMCGetDiffSum( );
      loop++;
      if(Diff_Sum > oldsum)
          diffstep = -(diffstep / 2);
      abs_helper = Diff_Sum - oldsum;
      if(abs_helper < 0)
          abs_helper = -abs_helper;
      }
   UMC_Sums[Z_AXIS] = Diff_Sum;
   }
UMC_Error_Percentage = VerifyUserMagCal( );
UMC_Pass_Fail = UMC_MATH_FIT_ERROR;
UMC_Iteration_Count = 10000 + loop;
if(UMC_Error_Percentage < FD.UMC_Pass_Fail_Threshold)
   UMC_Pass_Fail = PASS;
else
   return;
   US.UMC_Offsets[X_AXIS] = X_Average;
   US.UMC_Offsets[Y_AXIS] = Y_Average;
   US.UMC_Offsets[Z_AXIS] = Z_Average;
   DISABLE_INTERRUPTS( );
   US.UMC_Last_Cal_Voltage = Last_VBatt_Test_Result;
   US.UMC_Last_Cal_Temp = Temp_Data;
   US.UMC_Request_Flag = 0;
   ENABLE_INTERRUPTS( );
   SaveImage(USL);
   UMC_Iteration_Count = loop;
   }
void UMCGetDiffSum(void)
   {
   float rsum = 0;
   float ravg;
   float r[UMC_NUMBER_OF_POSITIONS];
   float abs_helper;
   unsigned char i;
   Diff_Sum = 0;
   for(i = 0;i < UMC_NUMBER_OF_POSITIONS;i++)
      {
      r[i] = (UMC_Mag_Array_X[i] - X_Average) * (UMC_Mag_Array_X[i] - X_Average);
      r[i] += (UMC_Mag_Array_Y[i] - Y_Average) * (UMC_Mag_Array_Y[i] - Y_Average);
      r[i] += (UMC_Mag_Array_Z[i] - Z_Average) * (UMC_Mag_Array_Z[i] - Z_Average);
      rsum += r[i];
      }
   ravg = rsum / UMC_NUMBER_OF_POSITIONS;
   for(i = 0;i < UMC_NUMBER_OF_POSITIONS;i++)
      {
      abs_helper = r[i] - ravg;
      if(abs_helper < 0)
          abs_helper = -abs_helper;
      Diff_Sum += abs_helper;
      }
```

-continued

```
}
float VerifyUserMagCal(void)
{
    unsigned char i;
    float r[UMC_NUMBER_OF_POSITIONS];
    float max = 0;
    float min = 100;
    for(i = 0;i < UMC_NUMBER_OF_POSITIONS;i++)
    {
        r[i] = (UMC_Mag_Array_X[i] - X_Average) * (UMC_Mag_Array_X[i] -
X_Average);
        r[i] += (UMC_Mag_Array_Y[i] - Y_Average) * (UMC_Mag_Array_Y[i] -
Y_Average);
        r[i] += (UMC_Mag_Array_Z[i] - Z_Average) * (UMC_Mag_Array_Z[i] -
Z_Average);
        r[i] = sqrt(r[i]);
        if(r[i] > max)
            max = r[i];
        if(r[i] < min)
            min = r[i];
    }
    return (max - min) / max * 100;
```

Figure 3:
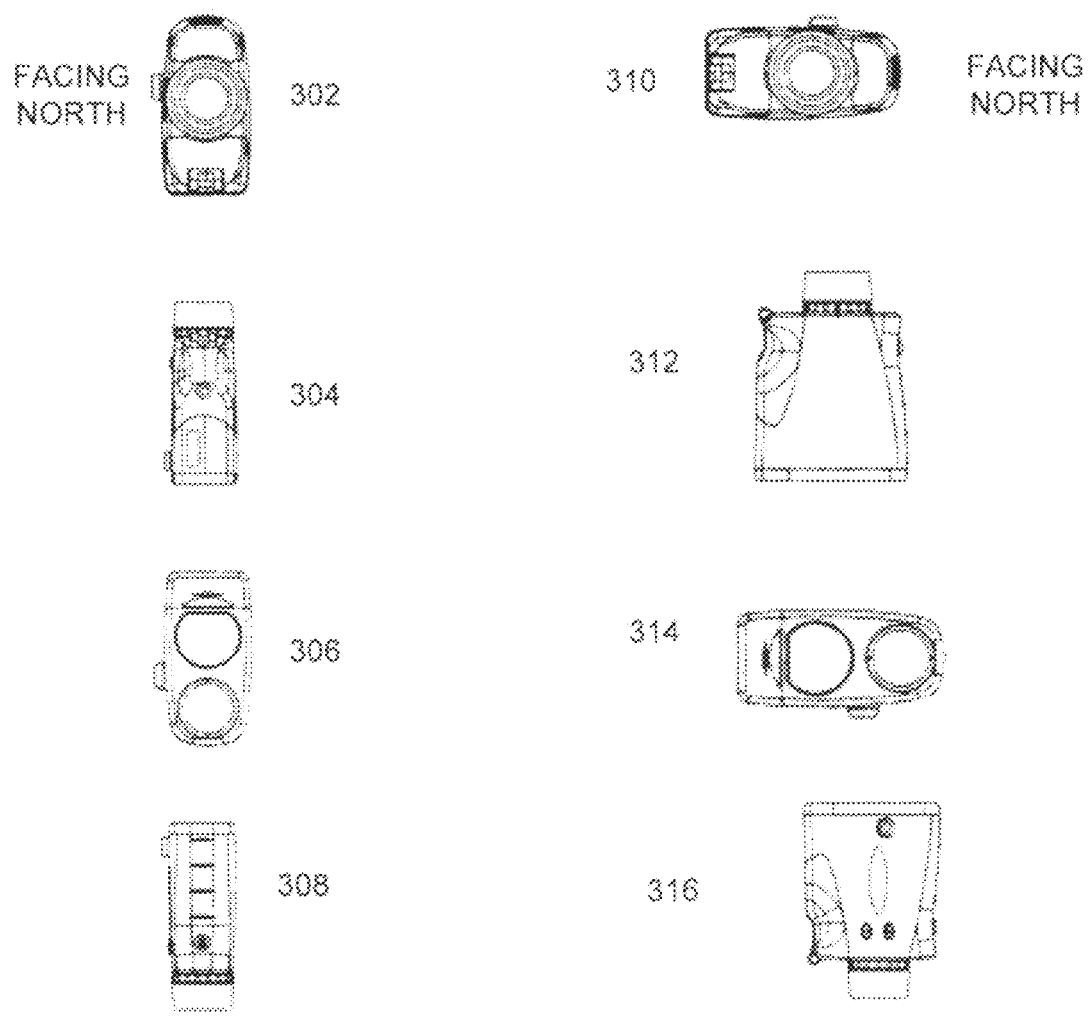
FIG. 3 illustrates a sampling technique according to another embodiment of the invention.

FIG. 3 illustrates a sampling technique according to another embodiment of the invention. Referring to FIG. 3, data points for the magnetic sensors and accelerometers may be obtained by pointing the apparatus facing close to magnetic North, about ±30 degrees towards North as shown by reference number 302. It is noted that theoretically the instrument does not have to be aimed at magnetic North, for example aiming the instrument east doing the same data measurements would also be acceptable in embodiments of the invention. However, the data obtained in ±30 degrees from magnetic North is more convenient to process.

The value measured can include magnetic field values such as $x_{mm1}$, $y_{mm1}$, $z_{mm1}$ and/or gravitation field values such as $x_{mt1}$, $y_{mt1}$, $z_{mt1}$. Next, as shown by reference number 304, the apparatus can be rotated about another 90 degrees and second measured values taken. The second measured values can include magnetic field values such as $x_{mm2}$, $y_{mm2}$, $z_{mm2}$ and/or gravitation field values such as $x_{mt2}$, $y_{mt2}$, $z_{mt2}$. As shown by reference number 306, the system is rotated another 90 degrees and third values obtained. The third measured values can include magnetic field values such as $x_{mm3}$, $y_{mm3}$, $z_{mm3}$ and/or gravitation field values such as $x_{mt3}$, $y_{mt3}$, $z_{mt3}$. As shown by reference number 308, the apparatus is rotated another 90 degrees and a fourth measurement is taken. The fourth measured values can include magnetic field values such as $x_{mm4}$, $y_{mm4}$, $z_{mm4}$ and/or gravitation field values such as $x_{mt4}$, $y_{mt4}$, $z_{mt4}$. As shown by reference number 310, the system is rotated about another 90 degrees and a fifth measurement is taken. The fifth measured values can include magnetic field values such as $x_{mm5}$, $y_{mm5}$, $z_{mm5}$ and/or gravitation field values such as $x_{mt5}$, $y_{mt5}$, $z_{mt5}$. As shown by reference number 312, the system is rotated another 90 degrees and a sixth measurement is taken. The sixth measured values can include magnetic field values such as $x_{mm6}$, $y_{mm6}$, $z_{mm6}$ and/or gravitation field values such as $x_{mt6}$, $y_{mt6}$, $z_{mt6}$. As shown by reference number 314, the system is rotated another 90 degrees and a seventh measurement is taken. The seventh measured values can include magnetic field values such as $x_{mm7}$, $y_{mm7}$, $z_{mm7}$ and/or gravitation field values such as $x_{mt7}$, $y_{mt7}$, $z_{mt7}$. As shown by reference number 316, the system is rotated another 90 degrees and an eighth measurement is taken. The eighth measured values can include magnetic field values such as $x_{mm8}$, $y_{mm8}$, $z_{mm8}$ and/or gravitation field values such as $x_{mt8}$, $y_{mt8}$, $z_{mt8}$. The measured values can be calibrated by solving for offset values as described herein.

With the offset values obtained, the error in the system can be substantially eliminated by subtracting the offset values from the measured values as described herein.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for calibrating sensors of an apparatus comprising a plurality of sensors and a controller coupled to the plurality sensors, the method comprising the steps of:
    sampling with the apparatus at least four data points to obtain measured field values;
    performing with the apparatus a mathematical operation to obtain offset values; and
    correcting with the apparatus the measured field values with the offset values to calibrate the apparatus,
wherein the mathematical operation step comprises solving for (xo, yo, zo) the offset values, $$R = \left( \frac{1}{n} \sum_{i=1}^{n} [(x_{mi} - x_0)^2 + (y_{mi} - y_0)^2 + (z_{mi} - z_0)^2] \right)^{1/2}$$

where $x_{mi}$ is the measured field value in the x-direction, $y_{mi}$ is the measured field value in the y-direction, $z_{mi}$ is the measured field value in the z-direction, $x_o$ is the offset value in the x-direction, $y_o$ is the offset value in the y-direction, $z_o$ is the offset value in the z-direction, R is the radius of the sphere on which all the nominal data points lie, and n is the number of data points.

2. The method of claim 1, wherein the measured field values include at least one of a measured magnetic field value in an x-direction, y-direction, and z-direction and a measured gravitation field value in an x-direction, y-direction, and z-direction.

3. The method of claim 1, wherein the mathematical operation step comprises iteratively solving for (xo, yo, zo) the offset values.

4. The method of claim 1, wherein the solving equation step is performed by the controller which is operative for executing software instructions.

5. The method of claim 1, wherein the apparatus is used in a range finder.

6. The method of claim 1, wherein the apparatus is used in a magnetic compass.

7. The method of claim 1, wherein the sampling at least four data points step further comprises the steps of sampling eight data points at various predetermined orientations of the apparatus.

8. The method of claim 7, wherein the apparatus comprises a front end, back end, top end, bottom end, left side, and right side and wherein the sampling eight data points step at various predetermined orientations comprises the steps of:
   positioning the front end of the apparatus to face within about 30 degrees of magnetic north and obtaining a first field value;
   rotating the apparatus about 90 degrees to an orientation where the front end is facing in a substantially upward direction and obtaining a second field value;
   rotating the apparatus about 90 degrees to an orientation where the front end is facing substantially within about 30 degrees of magnetic south and obtaining a third field value;
   rotating the apparatus about 90 degrees to an orientation facing substantially downward and obtaining a fourth field value;
   rotating the apparatus about 90 degrees to an orientation where the front end is facing within about 30 degrees of magnetic north and the left side of the apparatus is facing downward and obtaining a fifth field value;
   rotating the apparatus about 90 degrees to an orientation where the front end is facing in a substantially upward direction and obtaining a sixth field value;
   rotating the apparatus about 90 degrees to an orientation where the right-side is facing substantially downward and obtaining a seventh field value; and
   rotating the apparatus about 90 degrees to an orientation where the front is facing substantially downward and obtaining an eighth field value.

9. The method of claim 8, wherein each of the first through eighth field values comprise at least one of a measured magnetic field value in an x-direction, y-direction, and z-direction and a gravitation field value in an x-direction, y-direction, and z-direction.

10. The method of claim 8, wherein the apparatus is a tilt sensor.

11. An apparatus, comprising:
   a plurality of sensors; and
   a controller coupled to the plurality sensors,
   wherein the plurality of sensors is operative to be calibrated by sampling at least four data points to obtain measured field values; performing a mathematical operation to obtain offset values; and correcting the measured field values with the offset values,
   wherein the mathematical operation step comprises solving for (xo, yo, zo) the offset values, $$R = \left(\frac{1}{n}\sum_{i=1}^{n}[(x_{mi} - x_0)^2 + (y_{mi} - y_0)^2 + (z_{mi} - z_0)^2]\right)^{1/2}$$

where $x_{mi}$ is the measured field value in the x-direction, $y_{mi}$ is the measured field value in the y-direction, $z_{mi}$ is the measured field value in the z-direction, $x_o$ is the offset value in the x-direction, $y_o$ is the offset value in the y-direction, $z_o$ is the offset value in the z-direction, R is the radius of the sphere on which all the nominal data points lie, and n is the number of data points.

12. The apparatus of claim 11, wherein the measured field values include at least one of a measured magnetic field value in an x-direction, y-direction, and z-direction and a measured gravitation field value in an x-direction, y-direction, and z-direction.

13. The apparatus of claim 11, wherein the apparatus is used in a magnetic compass.

14. The apparatus of claim 11, wherein the apparatus is used in a range finder.

15. The apparatus of claim 11, wherein the apparatus is a three axis magnetometer.

16. The apparatus of claim 11, wherein the apparatus is a three axis accelerometer.

17. The apparatus of claim 11, wherein the plurality of sensors comprises two magnetic sensors and two accelerometers.

18. The apparatus of claim 17, wherein the two accelerometers are tilt sensors.

19. The apparatus of claim 12 wherein the plurality of sensors comprises a plurality of magnetic sensors to measure a magnetic field and a plurality of accelerometers to measure a gravitational field,
   wherein the plurality of magnetic sensors and the plurality of accelerometers are operative to be calibrated by sampling at least four data points from the plurality of magnetic sensors to obtain measured magnetic field values and sampling at least four data points from the plurality of accelerometers to obtain measured gravitational field values,
   wherein the controller is operative for performing a mathematical operation to obtain offset values corresponding to each of the measured magnetic field values and measured gravitational field values, and
   wherein the plurality of magnetic sensors and accelerometers are operative to be calibrated with the offset values for each of the measured magnetic field values and measured gravitational field values with the offset values.

20. The apparatus of claim 19, wherein the apparatus is used in a magnetic compass.

21. The apparatus of claim 19, wherein the apparatus is used in a range finder.

22. The apparatus of claim 19, wherein the controller comprises software operative for performing a mathematical operation to solve for $x_{om}$, $y_{om}$, $z_{om}$, the offset values corresponding to the measured magnetic field, $$R = \left(\frac{1}{n}\sum_{i=1}^{n}[(x_{mmi} - x_{0m})^2 + (y_{mmi} - y_{0m})^2 + (z_{mmi} - z_{0m})^2]\right)^{1/2}$$

where $x_{mmi}$ is the measured field value in the x-direction, $y_{mmi}$ is the measured field value in the y-direction, $z_{mmi}$ is the measured field value in the z-direction, $x_{om}$ is the offset value in the x-direction, $y_{om}$ is the offset value in the y-direction, $z_{om}$ is the offset value in the z-direction, R is the radius of the sphere on which all the nominal data points lie, and n is the number of data points.

23. The apparatus of claim 19, wherein the controller comprises software operative for performing a mathematical operation to solve for $x_{ot}$, $y_{ot}$, $z_{ot}$, the offset values corresponding to the measured gravitational field, $$R = \left(\frac{1}{n}\sum_{i=1}^{n}[(x_{mti}-x_{0t})^2 + (y_{mti}-y_{0t})^2 + (z_{mti}-z_{0t})^2]\right)^{1/2}$$

where $x_{mti}$ is the measured gravitational field value in the x-direction, $y_{mti}$ is the measured gravitational field value in the y-direction, $z_{mti}$ is the measured gravitational field value in the z-direction, $x_{ot}$ is the offset value in the x-direction, $y_{ot}$ is the offset value in the y-direction, $z_{ot}$ is the offset value in the z-direction, R is the radius of the sphere on which all the nominal data points lie, and n is the number of data points.

24. The apparatus of claim 19, wherein sampling at least four data points from the plurality of magnetic sensors to obtain measured magnetic field values and at least four data points from the plurality of accelerometers to obtain measured gravitational field values is capable of being performed substantially simultaneously.

25. The apparatus of claim 11, wherein the mathematical operation step comprises iteratively solving for (xo, yo, zo) the offset values.

* * * * *